(12) United States Patent
Loechelt et al.

(10) Patent No.: US 9,490,358 B2
(45) Date of Patent: Nov. 8, 2016

(54) ELECTRONIC DEVICE INCLUDING A VERTICAL CONDUCTIVE STRUCTURE

(71) Applicant: Semiconductor Components Industries, LLC, Phoenix, AZ (US)

(72) Inventors: Gary H. Loechelt, Tempe, AZ (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/628,987

(22) Filed: Feb. 23, 2015

(65) Prior Publication Data
US 2015/0171210 A1 Jun. 18, 2015

Related U.S. Application Data

(62) Division of application No. 13/794,150, filed on Mar. 11, 2013, now Pat. No. 8,999,782.

(51) Int. Cl.
| | |
|---|---|
| *H01L 29/78* | (2006.01) |
| *H01L 29/40* | (2006.01) |
| *H01L 29/66* | (2006.01) |
| *H01L 29/08* | (2006.01) |
| *H01L 29/417* | (2006.01) |
| *H01L 29/423* | (2006.01) |
| *H01L 29/10* | (2006.01) |
| *H01L 29/06* | (2006.01) |
| *H01L 21/28* | (2006.01) |

(52) U.S. Cl.
CPC ....... *H01L 29/7809* (2013.01); *H01L 21/2815* (2013.01); *H01L 29/0865* (2013.01); *H01L 29/0882* (2013.01); *H01L 29/402* (2013.01); *H01L 29/41741* (2013.01); *H01L 29/66674* (2013.01); *H01L 29/66689* (2013.01); *H01L 29/66696* (2013.01); *H01L 29/782* (2013.01); *H01L 29/7816* (2013.01); *H01L 29/063* (2013.01); *H01L 29/1095* (2013.01); *H01L 29/401* (2013.01); *H01L 29/4175* (2013.01); *H01L 29/41766* (2013.01); *H01L 29/42376* (2013.01)

(58) Field of Classification Search
None
See application file for complete search history.

(56) References Cited

U.S. PATENT DOCUMENTS

| | | |
|---|---|---|
| 5,354,712 A | 10/1994 | Ho et al. |
| 7,282,765 B2 | 10/2007 | Xu et al. |
| 7,868,379 B2 | 1/2011 | Loechelt |
| 7,902,017 B2 | 3/2011 | Loechelt |
| 7,989,857 B2 | 8/2011 | Loechelt |

(Continued)

*Primary Examiner* — Erik Kielin
(74) *Attorney, Agent, or Firm* — Abel Law Group, LLP

(57) ABSTRACT

An electronic device can include a buried conductive region and a semiconductor layer over the buried conductive region. The electronic device can further include a horizontally-oriented doped region and a vertical conductive region, wherein the vertical conductive region is electrically connected to the horizontally-oriented doped region and the buried conductive region. The electronic device can still further include an insulating layer overlying the horizontally-oriented doped region, and a first conductive electrode overlying the insulating layer and the horizontally-oriented doped region, wherein a portion of the vertical conductive region does not underlie the first conductive electrode. The electronic device can include a Schottky contact that allows for a Schottky diode to be connected in parallel with a transistor. Processes of forming an electronic device allow a vertical conductive region to be formed after a conductive electrode, a gate electrode, a source region, or both.

20 Claims, 14 Drawing Sheets

(56) References Cited

U.S. PATENT DOCUMENTS

| | | |
|---|---|---|
| 8,076,716 B2 | 12/2011 | Loechelt |
| 8,202,775 B2 | 6/2012 | Loechelt |
| 8,519,474 B2 | 8/2013 | Loechelt |
| 2002/0167047 A1* | 11/2002 | Yasuhara ............ H01L 29/1045 257/341 |
| 2010/0283093 A1 | 11/2010 | Pei et al. |

* cited by examiner

ELECTRONIC DEVICE INCLUDING A VERTICAL CONDUCTIVE STRUCTURE

CROSS-REFERENCE TO RELATED APPLICATION

The present application is a divisional application of U.S. patent application Ser. No. 13/794,150, filed Mar. 11, 2013, entitled "Process of Forming an Electronic Device Including a Vertical Conductive Structure," by Gary H. Loechelt et al., which is incorporated by reference herein in its entirety.

FIELD OF THE DISCLOSURE

The present disclosure relates to electronic devices and processes of forming electronic devices, and more particularly to, electronic devices including vertical conductive structures and processes of forming the same.

RELATED ART

An insulated gate field-effect transistors (IGFET) is a common type of transistor that can be used in power switching circuits. The IGFET includes a source region, a drain region, a channel region extending between the source and drain regions, and a gate structure adjacent to the channel region. The gate structure includes a gate electrode disposed adjacent to and separated from the channel region by a gate dielectric layer.

Power transistors should have a low on-state resistance and a low figure of merit. Conductive structures can be used to help reduce the on-state resistance and lower the figure of merit. However, such conductive structures may be formed using an overly complicated process flow or using processing steps with low process margin.

BRIEF DESCRIPTION OF THE DRAWINGS

Embodiments are illustrated by way of example and are not limited in the accompanying figures.

Figure 1:
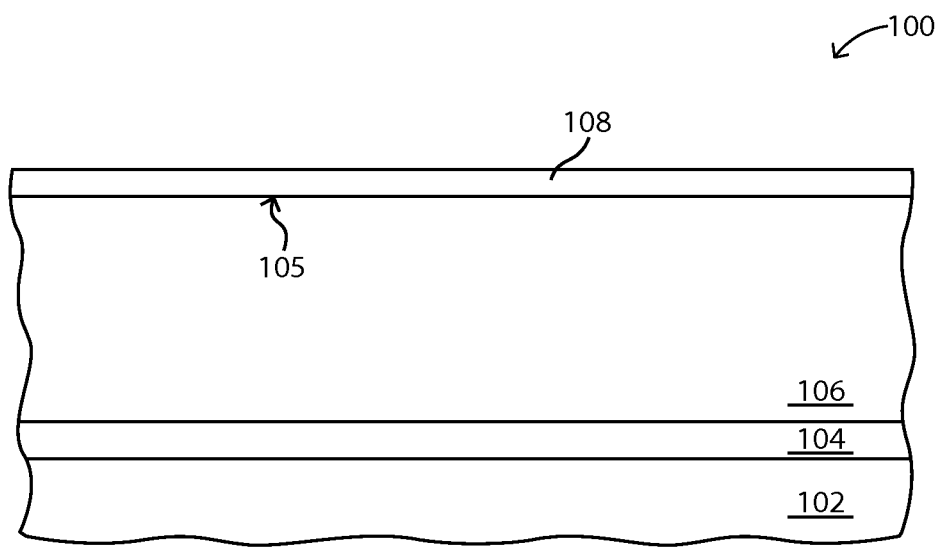
FIG. 1 includes an illustration of a cross-sectional view of a portion of a workpiece including a buried conductive region, a buried insulating layer, a semiconductor layer, and a dielectric layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used herein, the terms "horizontally-oriented" and "vertically-oriented," with respect to a region or structure, refer to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The term "power transistor" is intended to mean a transistor that is designed to normally operate with at least a 10 V difference maintained between the source and drain or emitter and collector of the transistor when the transistor is in an off-state. For example, when the transistor is in an off-state, a 10 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of Elements based on the IUPAC Periodic Table of Elements, version dated Jan. 21, 2011.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Vertical conductive regions that electrically connect a buried conductive region to current carrying electrodes of transistors and electrodes of Schottky diodes may be formed relatively late in a process flow. Such vertical conductive regions can be formed after forming conductive electrodes, gate electrodes, source regions, or any combination thereof. In an embodiment, some of the vertical conductive regions may not be electrically connected to an interconnect that is directly above such vertical conductive regions. An interconnect can be formed over other vertical conductive regions, such as one that electrically connects a source region of a transistor to the conductive electrodes. Particular details regarding the process and features are better understood after reading the embodiments described in conjunction with the figures, where such embodiments are meant to illustrate and not limit the scope of the present invention.

FIG. 1 includes an illustration of a cross-sectional view of a portion of a workpiece 100 that includes a buried conductive region 102, a buried insulating layer 104, a semiconductor layer 106, and a dielectric layer 108. The buried conductive region 102 can include a Group 14 element (i.e., carbon, silicon, germanium, or any combination thereof) and can be heavily n-type or p-type doped. For the purposes of this specification, heavily doped is intended to mean a peak dopant concentration of at least approximately $1\times10^{19}$ atoms/cm$^3$, and lightly doped is intended to mean a peak dopant concentration of less than approximately $1\times10^{19}$ atoms/cm$^3$. The buried conductive region 102 can be a portion of a heavily doped substrate (e.g., a heavily n-type doped wafer) or may be a buried doped region disposed over a substrate of opposite conductivity type or over another buried insulating layer (not illustrated) that is disposed between a substrate and the buried conductive region 102. In an embodiment, the buried conductive region 102 is heavily doped with an n-type dopant, such as phosphorus, arsenic, antimony, or any combination thereof. In a particular embodiment, the buried conductive region 102 includes arsenic or antimony if diffusion of the buried conductive region 102 is to be kept low, and in a particular embodiment, the buried conductive region 102 includes antimony to reduce the level of autodoping (as compared to arsenic) during formation of a subsequently-formed semiconductor layer. The buried conductive region 102 will be used to electrically connect a drain of a transistor and an a cathode of a Schottky diode to each other.

The buried insulating layer 104 is disposed over the buried conductive region 102. During normal operation, the buried insulating layer 104 helps to isolate the voltage on the buried conductive region 102 from portions of the semiconductor layer 106. The buried insulating layer 104 can include an oxide, a nitride, or an oxynitride. The buried insulating layer 104 can include a single film or a plurality of films having the same or different compositions. The buried insulating layer 104 can have a thickness in a range of at least approximately 0.2 micron or at least approximately 0.3 micron. Further, the buried insulating layer 104 may have a thickness no greater than approximately 5.0 microns or no greater than approximately 2.0 microns. In a particular embodiment, the buried insulating layer 104 has a thickness in a range of approximately 0.5 micron to approximately 0.9 micron. The buried insulating layer 104 is not required, and in another embodiment, the semiconductor layer 106 can be formed on the buried conductive region 102.

The semiconductor layer 106 is disposed over the buried insulating layer 104 and has a primary surface 105 where the transistors and other electronic components (not illustrated) are formed. The semiconductor layer 106 can include a Group 14 element and any of the dopants as described with respect to the buried conductive region 102 or dopants of the opposite conductivity type. In an embodiment, the semiconductor layer 106 is a lightly doped n-type or p-type epitaxial silicon layer having a thickness in a range of approximately 0.2 micron to approximately 5.0 microns, and a doping concentration no greater than approximately $1\times10^{17}$ atoms/cm$^3$, and in another embodiment, a doping concentration of at least approximately $1\times10^{14}$ atoms/cm$^3$. The semiconductor layer 106 may be disposed over all of the workpiece 100. The dopant concentration within the semiconductor layer 106 as formed or before selectively doping regions within the semiconductor layer 106 will be referred to as the background dopant concentration.

The dielectric layer 108 can be formed over the semiconductor layer 106 using a thermal growth technique, a deposition technique, or a combination thereof. The dielectric layer 108 can include an oxide, a nitride, an oxynitride, an organic dielectric, or any combination thereof. In an embodiment, the dielectric layer 108 includes an oxide and has a thickness in a range of approximately 11 nm to approximately 50 nm.

Figure 2:
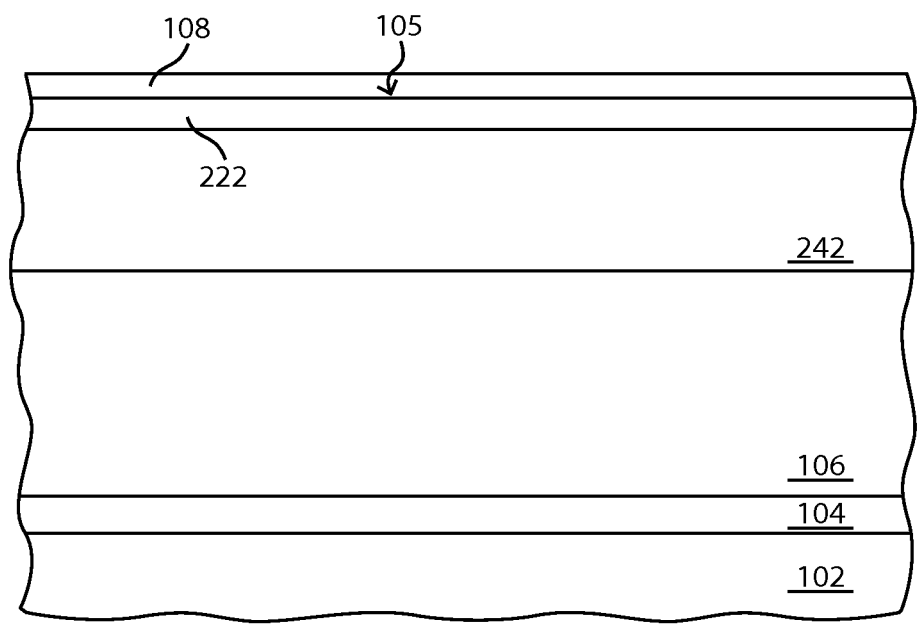
FIG. 2 includes an illustration of a cross-sectional view of the workpiece of FIG. 1 after forming a horizontally-oriented doped region and a resurf region.

FIG. 2 illustrates the workpiece after forming horizontally-oriented doped regions 222 and resurf regions 242, wherein one of each is illustrated in FIG. 2. Within a power transistor being formed, the horizontally-oriented doped regions 222 can be at least part of a drain region of a transistor. For a Schottky contact, the horizontally-oriented doped regions 222 can allow for a lower resistance current path as compared to a vertical current path that would pass through the entire thickness of the semiconductor layer 106 if the buried insulating layer 104 would not be present (in another embodiment, not illustrated). In a normal operating state, the charge carriers (for example, electrons) or current flows through the horizontally-oriented doped regions 222 principally in a horizontal direction. The horizontally-oriented doped regions 222 can have a dopant concentration of less than approximately $1\times10^{19}$ atoms/cm$^3$ and at least approximately $1\times10^{16}$ atoms/cm$^3$ and a depth in one embodiment of less than approximately 0.9 micron, and in another embodiment of less than approximately 0.5 micron. In a particular embodiment, the horizontally-oriented doped regions 222 are n-type doped.

The resurf regions 242 can help keep more current flowing through the horizontally-oriented doped regions 222 instead of into the semiconductor layer 106 underlying the horizontally-oriented doped regions 222. The resurf regions 242 may have a dopant concentration of no greater than approximately $5\times10^{17}$ atoms/cm$^3$ and at least approximately $1\times10^{16}$ atoms/cm$^3$, and a depth in one embodiment of less than approximately 1.5 microns, and in another embodiment of less than approximately 1.2 microns. The peak concentration of the resurf regions 242 may be in a range of approximately 0.5 micron to approximately 0.9 micron below the primary surface 105. In a particular embodiment, the resurf regions 242 are p-type doped.

In an embodiment, the horizontally-oriented doped regions 222 can be formed before the resurf regions 242. In another embodiment, the horizontally-oriented doped regions 222 can be formed after the resurf regions 242.

Figure 3:
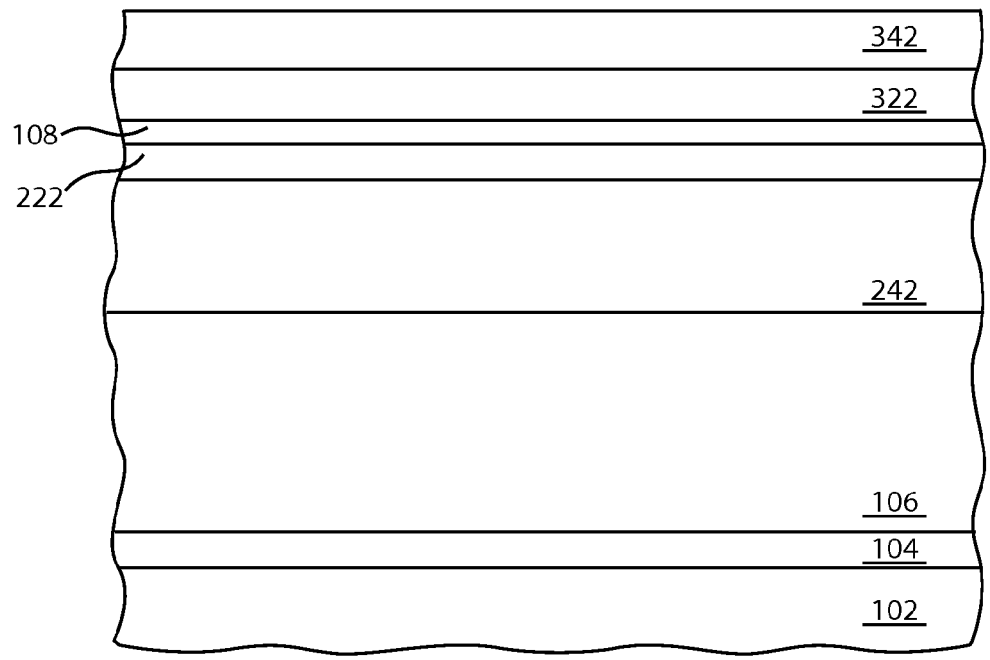
FIG. 3 includes an illustration of a cross-sectional view of the workpiece of FIG. 2 after forming an insulating layer and a conductive layer.

FIG. 3 includes an illustration after forming an insulating layer 322 and a conductive layer 342. The insulating layer 322 can formed using a thermal growth technique, a deposition technique, or a combination thereof. The insulating layer 322 can include an oxide, a nitride, an oxynitride, or any combination thereof. In an embodiment, the insulating layer 322 includes a nitride and has a thickness in a range of approximately 20 nm to approximately 90 nm. The conductive layer 342 is deposited over the insulating layer 322. The conductive layer 342 includes a conductive material or may be made conductive, for example, by doping. More particularly, the conductive layer 342 can include a doped semiconductor material (e.g., heavily doped amorphous silicon, polysilicon, etc.), a metal-containing material (a refractory metal, a refractory metal nitride, a refractory metal silicide, etc.), or any combination thereof. The conductive layer 342 has a thickness in a range of approximately 0.05 micron to approximately 0.5 micron. In a particular embodiment, the conductive layer 342 will be used to form a conductive electrode that can help to reduce drain-to-gate capacitance.

Figure 4:
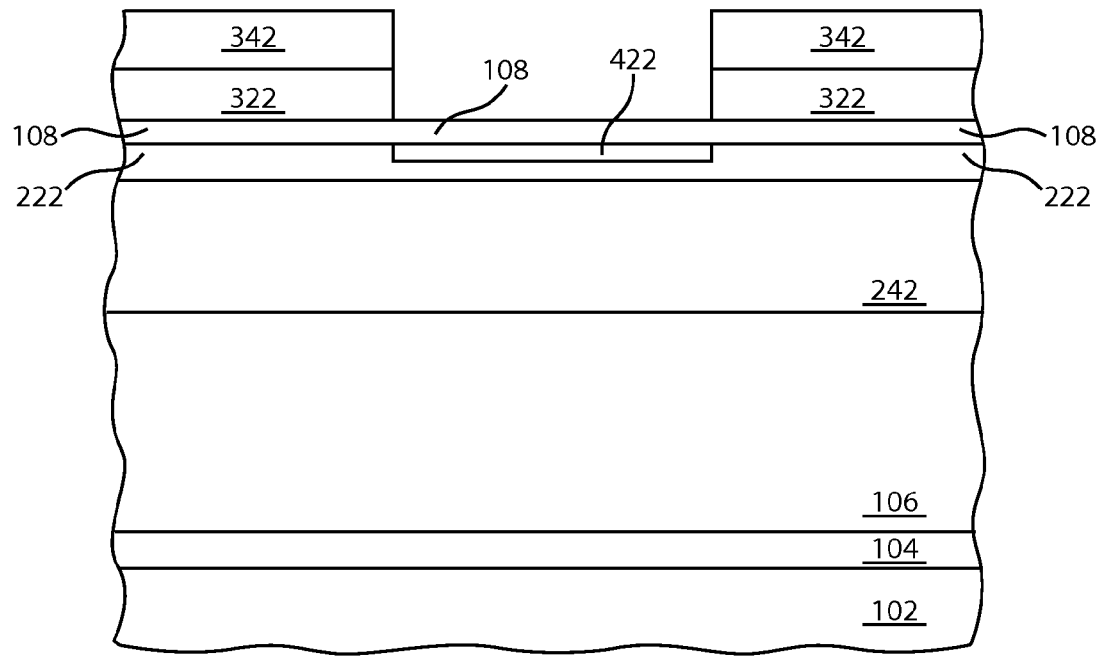
FIG. 4 includes an illustration of a cross-sectional view of the workpiece of FIG. 3 after patterning the conductive layer and the insulating layer and doping a portion of the horizontally-oriented doped region where a Schottky contact will be subsequently formed.

The conductive layer 342 and insulating layer 322 are patterned at locations where a Schottky contact will be formed, such as the location as illustrated in FIG. 4. A dopant of opposite conductivity type as compared to the horizontally-oriented doped region 222 is implanted within region 422. In the finished electronic device, the amount of dopant within region 422 reduces the majority carrier concentration within the horizontally-oriented doped region 222 but does not counterdope the horizontally-doped region 222. The locally lower concentration can help to reduce reverse leakage current in the Schottky diode. The dose of the implant can be less than approximately $1\times10^{15}$ ions/cm$^2$, and the energy can be selected to achieve a projected range no greater than approximately 0.15 micron. In an embodiment, the power transistor is covered by a masking layer (not illustrated) and thus, the dopant introduced into the region 422 is not introduced into the power transistor. In other figures, the region 422 is illustrated with a dashed line to indicate that the region has a lower net dopant concentration as compared to a remainder of the horizontally-oriented doped region 222.

Figure 5:
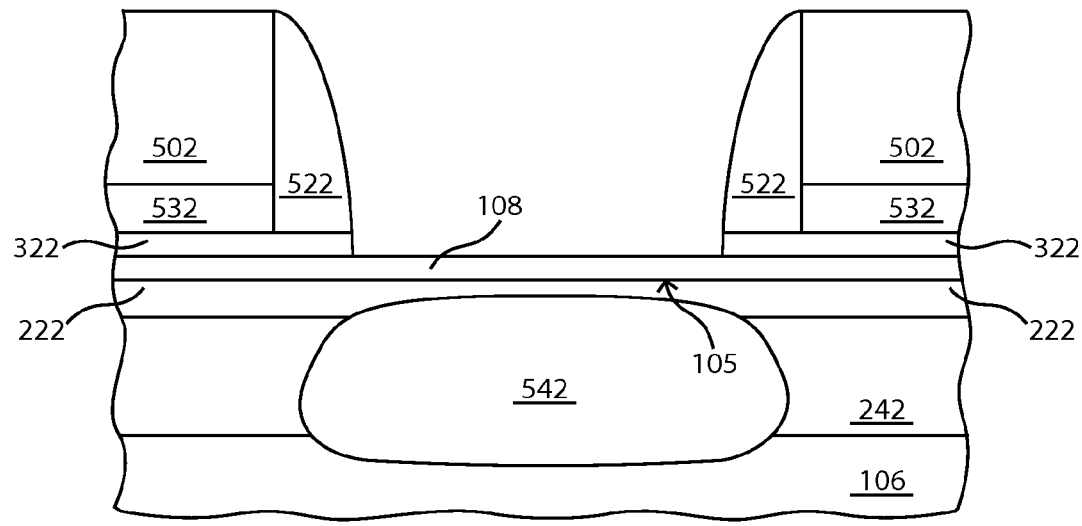
FIG. 5 includes an illustration of a cross-sectional view of the workpiece of FIG. 3 after forming insulating members, patterning the conductive layer to form a conductive electrode, insulating sidewall spacers, and a deep body doped region.

FIG. 5 includes an illustration after forming an insulating layer 502, patterning the insulating layer 502, patterning the conductive layer 342 to form conductive electrodes 532, and forming insulating spacers 522 and deep body doped regions 542. Substantially all of the region where the Schottky contact will be formed (not illustrated in FIG. 5) is covered with the insulating layer 502, which is not patterned in such region. The insulating layer 502 can include one or more insulating films. In the embodiment as illustrated in FIG. 5, an insulating layer 502 is deposited over the conductive layer 342. The insulating layer 502 can include an oxide, a nitride, any oxynitride, or an organic dielectric. The insulating layer 502 has a thickness in a range of approximately 0.2 micron to approximately 2.0 microns.

A masking layer (not illustrated) is formed over the insulating layer 502 and patterned to define an opening where the transistor is being formed. Portions of the conductive layer 342 are patterned, and the masking features are removed. Remaining portions of the conductive layer 342 are conductive electrodes 532 that can help to reduce drain-to-gate capacitance in the transistor. The insulating spacers 522 are formed along the sidewalls of the conductive electrodes 532 and the insulating layer 502. In a particular embodiment, the insulating spacers 522 include a nitride and are formed by depositing a nitride layer to a thickness in a range of approximately 20 nm to approximately 90 nm and anisotropically etching the nitride layer to form the insulating spacers 522. Openings defined by the insulating spacers 522 are disposed over portions of the semiconductor layer 106 where deep body doped region 542 and source and channel regions will be formed.

The deep body doped region 542 can provide alternative paths during avalanche breakdown between the drain region of the transistor and the deep body doped region 542 as opposed to avalanche breakdown between the drain region and a subsequently-formed channel region. In an embodiment, the peak concentration of the deep body doped region 542 is at least approximately 0.1 micron deeper than the peak concentration of the channel region, and in another embodiment, the peak concentration of the deep body doped region 542 is no greater than approximately 0.9 micron deeper than the peak concentration of the channel region. In a further embodiment, the peak concentration of the deep body doped region 542 is in a range of approximately 0.6 micron to approximately 1.1 microns below the primary surface 105. The deep body doped region 542 can be formed using a single implant or a combination of implants. The deep body doped region 542 may or may not contact the buried insulating layer 104. For a single implant or for the implant (of a combination of implants) having the lowest projected range, the dose can be in a range of approximately $5 \times 10^{13}$ ions/cm$^2$ to approximately $5 \times 10^{14}$ ions/cm$^2$.

Figure 6:
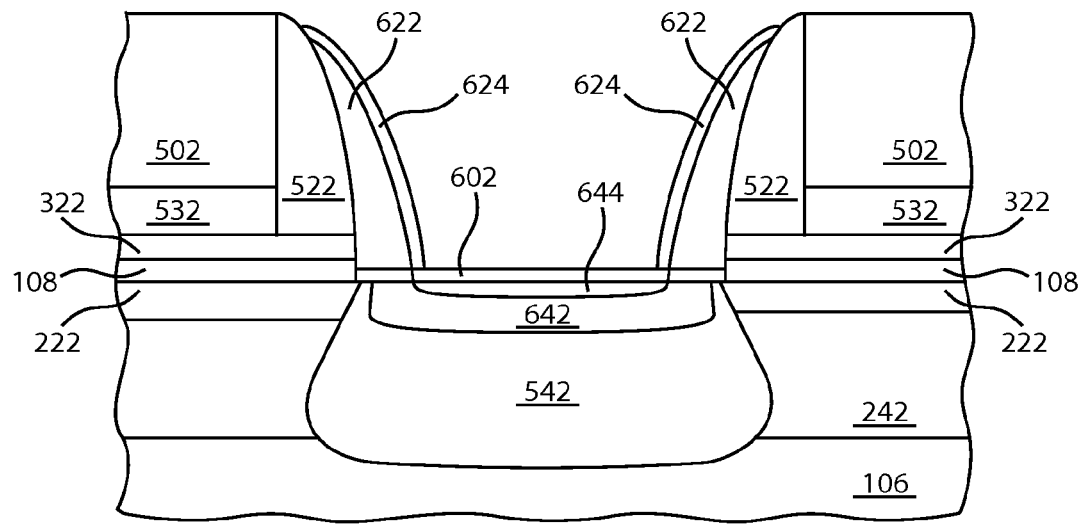
FIG. 6 includes an illustration of a cross-sectional view of the workpiece of FIG. 5 after forming a body region, gate electrodes, an insulating layer, and a source region.

FIG. 6 includes an illustration of the workpiece after forming a gate dielectric layer 602, gate electrodes 622, an insulating layer 624 along exposed surfaces of the gate electrodes 622, a body region 642, and a source region 644. The body region 642 may include a channel region for the transistor. The body region 642 has the same conductivity type as the channel region and the deep body doped region 542 and can have a peak dopant concentration of at least approximately $1 \times 10^{18}$ atoms/cm$^3$. In another embodiment, not illustrated, a channel region for the transistor may be formed separately. Such a channel region can be formed by ion implantation with a dose in a range of approximately $5 \times 10^{12}$ ions/cm$^2$ to approximately $5 \times 10^{13}$ ions/cm$^2$. The energy can be selected to achieve a projected range of approximately 0.05 micron to approximately 0.3 micron.

The exposed portion of the dielectric layer 108 is removed by etching, and the gate dielectric layer 602 is formed over the exposed surface along the bottoms of the openings. In a particular embodiment, the gate dielectric layer 602 includes an oxide, a nitride, an oxynitride, or any combination thereof and has a thickness in a range of approximately 5 nm to approximately 50 nm. The gate electrodes 622 are disposed over the gate dielectric layer 602 and are spaced apart and electrically isolated from the conductive electrodes 532. The gate electrodes 622 can be formed by depositing a layer of material that is conductive as deposited or can be subsequently made conductive. The layer of material can include a metal-containing or semiconductor-containing material. In an embodiment, the layer is deposited to a thickness of approximately 0.1 micron to approximately 0.5 micron. The layer of material is etched to form the gate electrodes 622. In the illustrated embodiment, the gate electrodes 622 are formed without using a mask and have shapes of sidewall spacers. The widths of the gate electrodes 622 at their bases are substantially the same as the thickness of the layer as deposited.

The insulating layer 624 can be thermally grown from the gate electrodes 622 or may be deposited over the workpiece. The thickness of the insulating layer 624 can be in a range of approximately 10 nm to approximately 30 nm. The source region 644 is formed from a portion of the body region 642. The source region 644 can include extension portions and a heavily doped portion. The extension portions can have a dopant concentration higher than approximately $5 \times 10^{17}$ atoms/cm$^3$ and less than approximately $5 \times 10^{19}$ atoms/cm$^3$. If needed or desired, an additional set of insulating spacers (not illustrated) may be formed before forming the heavily doped portion of the source region 644. Such insulating spacers are formed to cover the extension portions of the source region 644 and to displace the heavily doped portion 644 further from the gate electrodes 622. The insulating spacers can be formed by depositing an insulating layer and anisotropically etching the insulating layer. The insulating spacers can include an oxide, a nitride, an oxynitride, or any combination thereof, and have widths at the bases of the insulating spacers in a range of approximately 50 nm to approximately 200 nm.

The doping for the heavily doped portion of the source region 644 can be performed after the insulating layer 624 is formed. The heavily doped portion of the source region 644 allows ohmic contacts to be subsequently made and have a dopant concentration of at least approximately $1 \times 10^{19}$ atoms/cm$^3$. The source regions 644 can be formed using ion implantation, have an opposite conductivity type as compared to the body regions 642, and the same conductivity type as the horizontally-oriented doped regions 222 and the buried conductive region 102.

Figure 7:
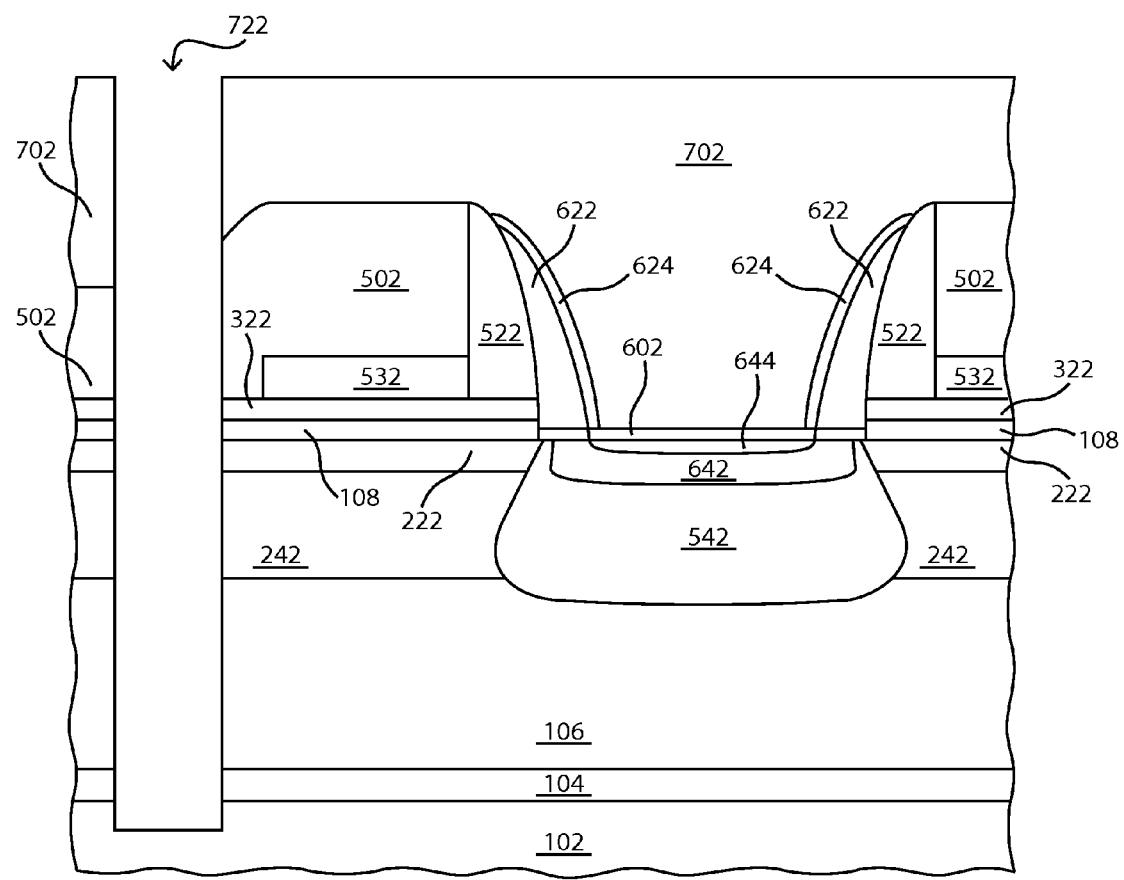
FIG. 7 includes an illustration of a cross-sectional view of the workpiece of FIG. 6 after forming an ILD layer and a trench extending to the buried conductive region.
Figure 8:
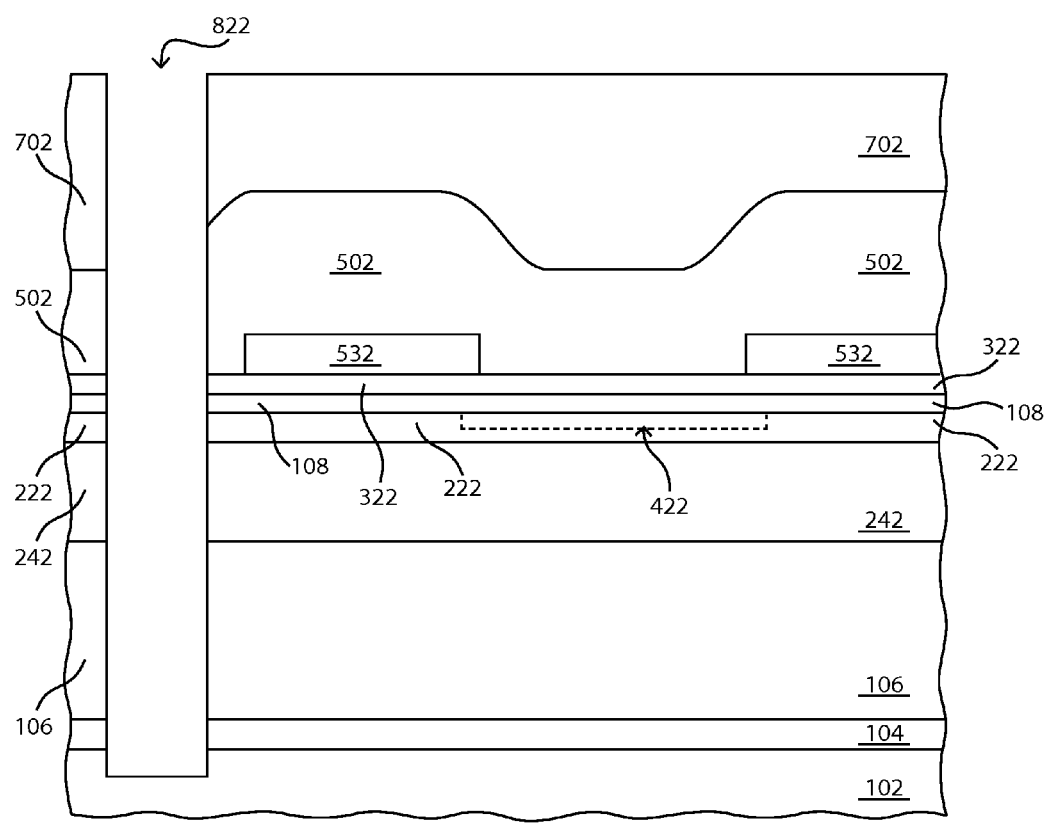
FIG. 8 includes an illustration of a cross-sectional view of a portion the workpiece of FIG. 6 adjacent to where a Schottky contact will be formed, wherein FIG. 8 includes the ILD layer and another trench extending to the buried conductive region.

FIGS. 7 and 8 include illustrations of the workpiece after forming an interlevel dielectric (ILD) layer 702 over substantially all of the workpiece. FIG. 7 corresponds to a portion of the workpiece adjacent to the transistor, and FIG. 8 corresponds to a portion of the workpiece where a Schottky contact will be subsequently formed. The ILD layer 702 can include an oxide, a nitride, an oxynitride, an organic dielectric, or any combination thereof. The ILD layer 702 can include a single film having a substantially constant or changing composition (e.g., a high phosphorus content further from the semiconductor layer 106) or a plurality of discrete films. An etch-stop film, an antireflective film, or a combination may be used within or over the ILD layer 702 to help with processing. The ILD layer 702 can be deposited to a thickness in a range of approximately 0.5 micron to approximately 2.0 microns. The ILD layer 702 may be planarized to improve process margin during subsequent processing operations (for example, lithography, subsequent polishing, or the like).

Portions of the ILD layer 702, the insulating layers 502 and 322, the dielectric layer 108, the horizontally-oriented doped regions 222, the resurf regions 242, the semiconductor layer 106, and the buried insulating layer 104 are patterned to define trenches 722 and 822 that exposed portions of the buried conductive region 102. A patterned masking layer (not illustrated) is formed over the ILD layer 702. Portions of the ILD layer 702, the insulating layers 502 and 322, and the dielectric layer 108 are etched to define portions of the openings above the horizontally-oriented doped regions 222. At this point in the process, the patterned masking layer may be removed. Alternatively, the patterned masking layer may remain over the ILD layer 702 until the buried insulating layer 104 is etched or until all etching associated with the trenches 722 and 822 is completed.

Portions of the horizontally-oriented doped regions 222, the resurf regions 242, the semiconductor layer 106 and the buried insulating layer 104 are etched. If needed or desired, etching can be continued to etch a portion of the buried conductive region 102. In an embodiment, the trenches 722 and 822 may extend at least approximately 0.2 micron into the buried conductive region 102, and in another embodiment, the trenches 722 and 822 may extend at least approximately 0.3 micron into the buried conductive region 102. In a further embodiment, the trenches 722 and 822 may extend no greater than approximately 5.0 micron into the buried conductive region 102, and in still a further embodiment, the trenches 722 and 822 may extend no greater than approximately 2.0 microns into the buried conductive region 102. In another embodiment, the trenches 722 and 822 may be deeper or shallower than described above. In a particular embodiment, the width of each of the trenches 722 and 822 is at least approximately 0.05 micron or approximately 0.2 micron, and in another particular embodiment, the width of each of the trenches 722 and 822 is no greater than approximately 2 microns or approximately 1 micron. Dimensions of the trenches 722 and 822 may be the same or different from each other.

A conductive layer is formed over the ILD layer 702 and within the trenches 722 and 822, and, in a particular embodiment, the conductive layer substantially fills the trenches 722 and 822. The conductive layer can be polycrystalline and include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, tungsten, or the like; the barrier film can include a refractory metal nitride, such as titanium nitride, tantalum nitride, tungsten nitride, or the like, or a refractory metal-semiconductor-nitride, such as TaSiN; and the conductive fill material can include tungsten or tungsten silicide. In a more particular embodiment, the conductive layer can include Ti/TiN/W. The selection of the number of films and composition(s) of those film(s) depends on electrical performance, the temperature of a subsequent heat cycle, another criterion, or any combination thereof. Refractory metals and refractory metal-containing compounds can withstand high temperatures (e.g., melting points of the refractory metals can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

Figure 9:
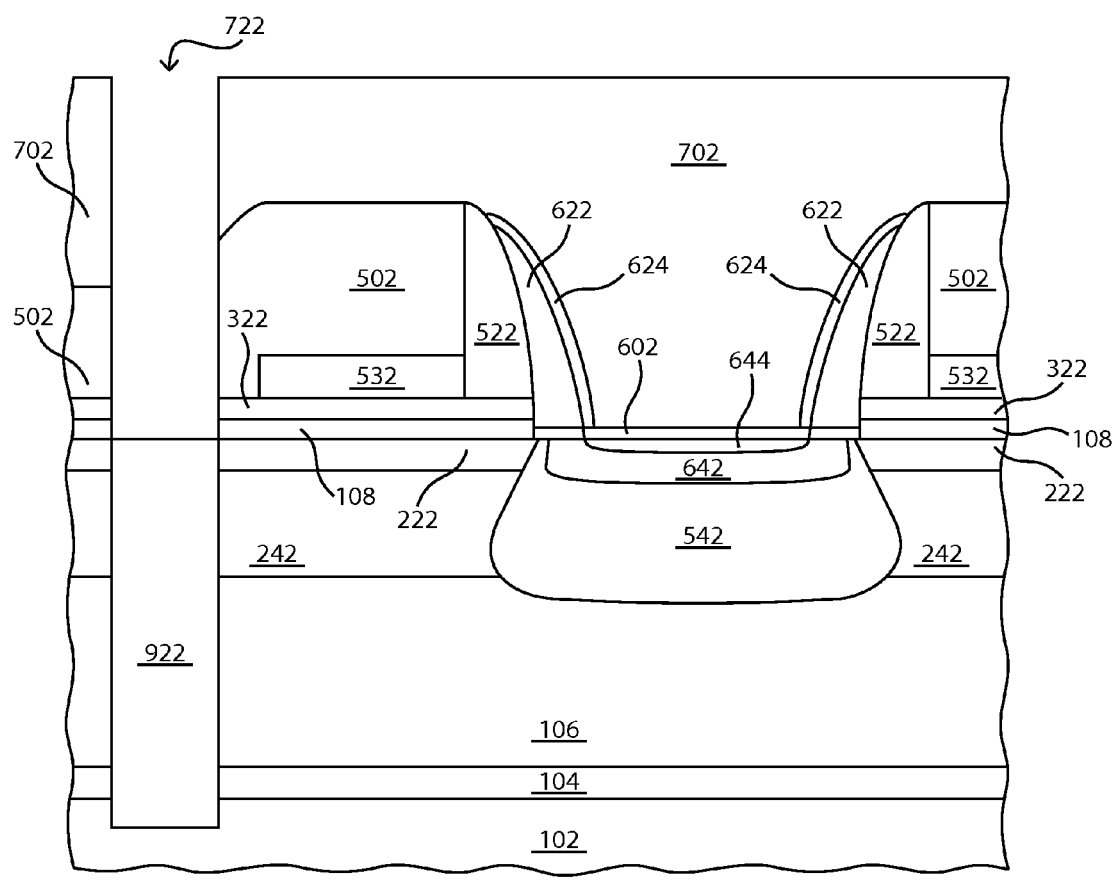
FIGS. 9 and 10 include illustrations of cross-sectional views of the workpiece of FIGS. 7 and 8, respectively, after forming vertical conductive structures within the trenches.
Figure 10:
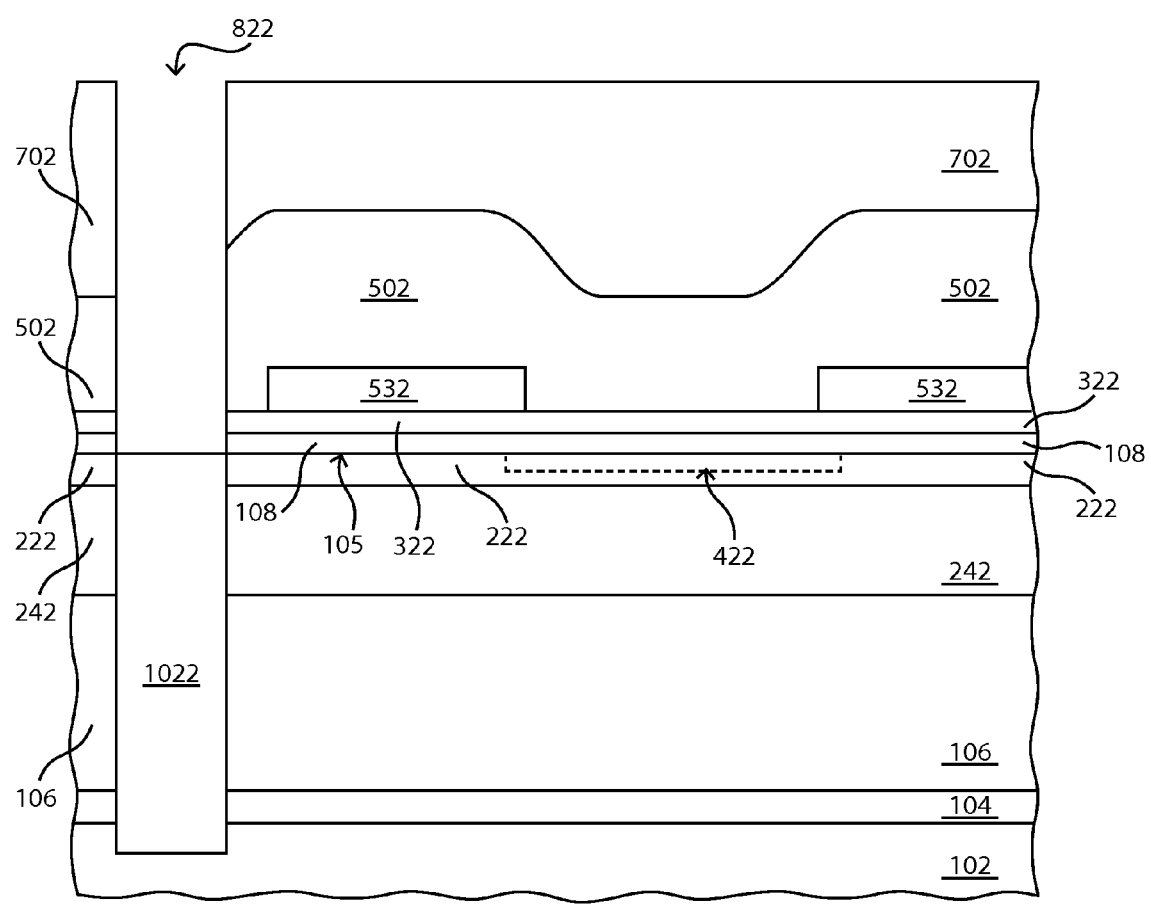

A portion of the conductive layer that is disposed over the ILD layer 702 is removed. The removal can be performed using a chemical-mechanical polishing or blanket etching technique. An etch or other removal operation is performed to recess the conductive layer further into the trenches 722 and 822 to form vertical conductive structures 922 and 1022, as illustrated in FIGS. 9 and 10. The vertical conductive structures 922 and 1022 couple the horizontally-oriented doped regions 222 and the buried conductive region 102 to one another, and in the embodiment as illustrated in FIGS. 9 and 10, electrically connect the horizontally-oriented doped regions 222 and the buried conductive region 102 to one another. The uppermost elevations of the vertical conductive structures 922 and 1022 lie at least at a lowest elevation of the horizontally-oriented doped regions 222 immediately adjacent to the trenches 722 and 822. As the uppermost elevations of the vertical conductive structures 922 and 1022 extend to elevations higher than the horizontally-oriented doped regions 222, parasitic capacitive coupling to the conductive electrodes 532 or the gate electrodes 622 can increase. In a particular embodiment, the vertical conductive structures 922 and 1022 may extend to an elevation no higher than the primary surface 105. None of the vertical conductive structures 922 and 1022 are covered by the conductive electrodes 532. In a finished electronic device, the buried conductive region 102 can provide an electrical connection to the drain of the transistor and the cathode of the Schottky diode.

The vertical conductive structures 922 and 1022 are examples of vertical conductive regions. In another embodiment, a different type of vertical conductive region may be used. For example, in an embodiment in which the buried insulating layer 104 is not present, the vertical conductive regions may be the vertical conductive structures 922 and 1022 or may be formed by doping portions of the horizontally-oriented doped regions 222, resurf regions 242 and semiconductor layer 106 to form heavily doped regions extending from the horizontally-oriented doped regions 222 to the buried conductive region 102. The heavily doped regions have the same conductivity type as the horizontally-oriented doped regions 222 and can have a shape similar to the vertical conductive regions 922 and 1022. The heavily doped regions may be formed using different implants at different energies, so that a relatively low resistance connection is made between the horizontally-oriented doped regions 222 and the buried conductive region 102.

Figure 11:
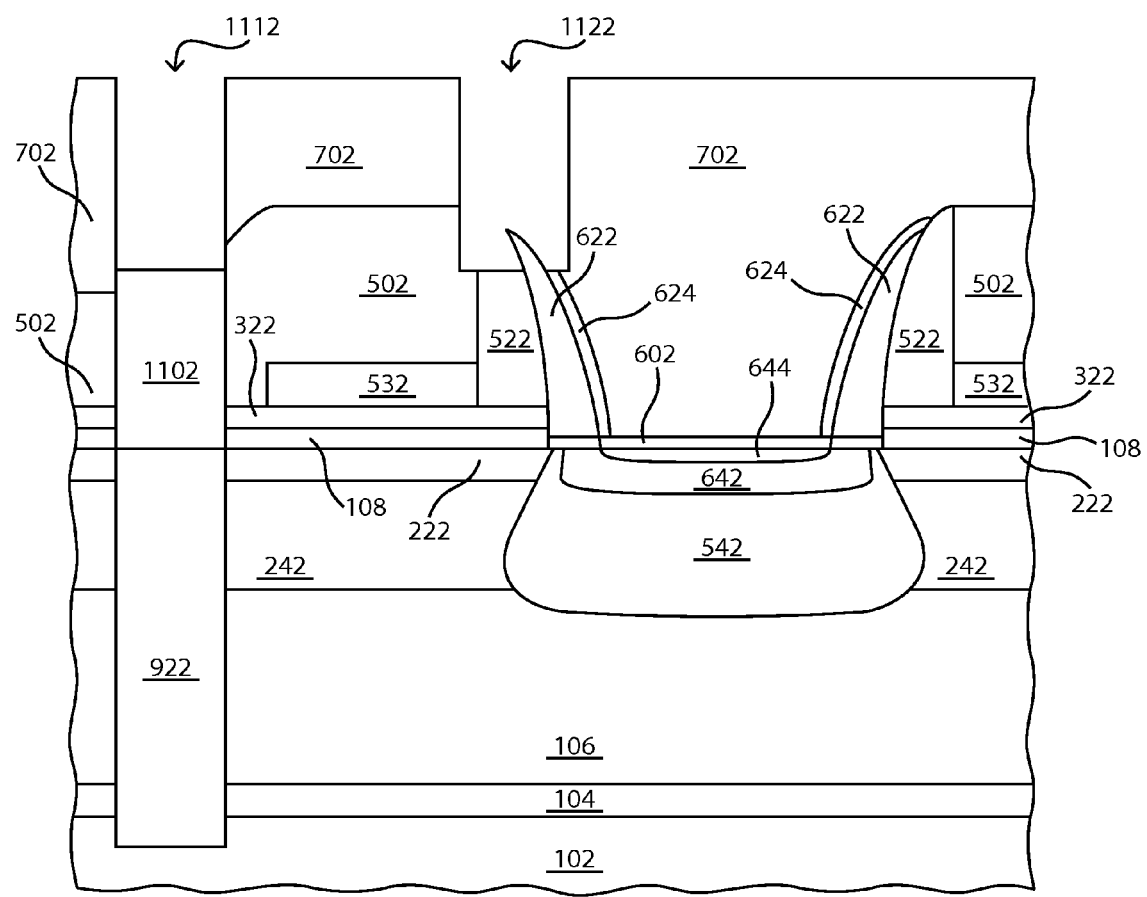
FIG. 11 includes an illustration of a cross-sectional view of the workpiece of FIG. 9 after forming another ILD layer and an opening over the vertical conductive structures and another opening to the gate electrode.

FIG. 11 includes an illustration of the workpiece after forming an ILD layer 1102 and openings 1112 and 1122. The ILD layer 1102 is formed over the ILD layer 702 and substantially fills remaining portions of the trenches 722 and 822. The ILD layer 1102 can include any of the materials, films, and thicknesses as previously described with respect to the ILD layer 702. The ILD layer 1102 can have the same or different materials, films, and thicknesses as compared to the ILD layer 702. The ILD layer 1102 can be planarized. In the embodiment as illustrated in FIG. 11, the portion of the ILD layer 1102 overlying the ILD layer 702 are removed. In another embodiment (not illustrated), some of the ILD layer 1102 may remain over the ILD layer 702. At this point in the process, the ILD layer 1102 substantially fills the remainders of the trenches 722 and 822. A patterned masking layer (not illustrated) is formed over the workpiece and defines openings under which conductive plugs will be subsequently formed. The patterned masking layer covers the trench 822, and thus, the ILD layer 1102 within the trench 822 is substantially unaffected when forming the openings. In the embodiment as illustrated in FIG. 11, openings are formed and include an opening 1122 to the gate electrode 622 and an opening 1112 over and spaced apart from the vertical conductive structure 922 for the transistor. Although not illustrated in FIG. 11, the openings can include an opening to the conductive electrode 532.

Figure 12:
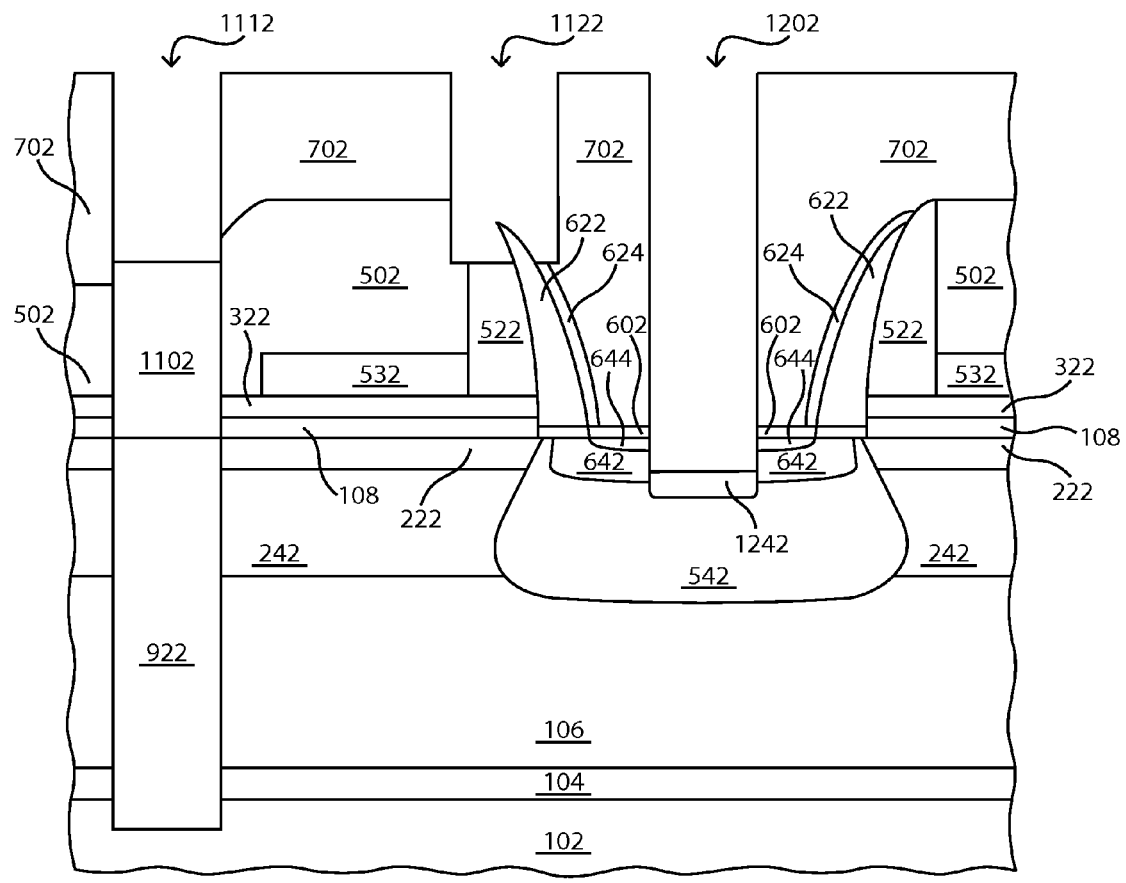
FIG. 12 includes an illustration of a cross-sectional view of the workpiece of FIG. 11 after forming an opening to the body region and a heavily doped region along a bottom of the opening to the body region.
Figure 13:
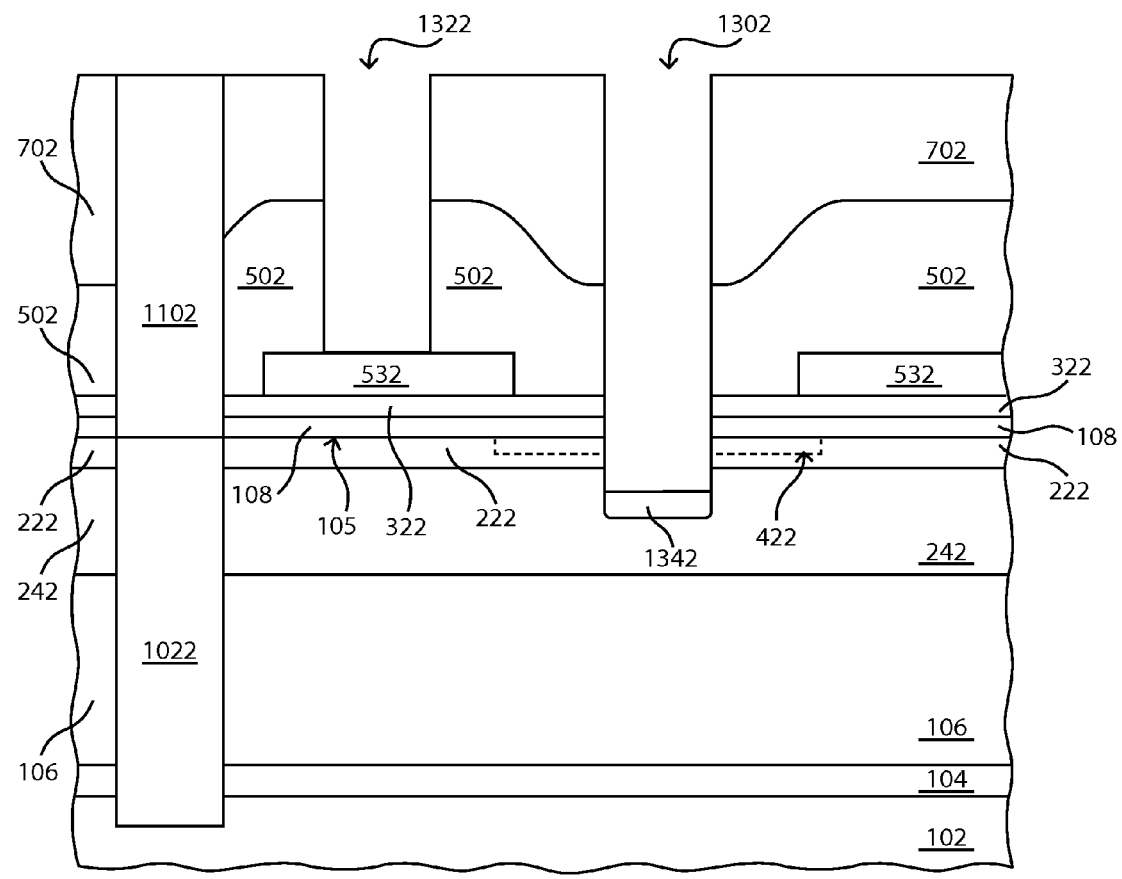
FIG. 13 includes an illustration of a cross-sectional view of the workpiece of FIG. 10 at substantially the same point in processing as FIG. 12 after forming an opening extending to the resurf region and a heavily doped region along a bottom of the opening.

FIGS. 12 to 13 include illustrations of the workpiece after forming openings 1202, 1302, and 1332 and doped regions 1242 and 1342. FIG. 12 corresponds to the transistor, and FIG. 13 corresponds to a portion of the workpiece where Schottky contacts will be formed. In FIG. 13, the opening 1332 to the conductive electrode 532 can be formed when the openings 1112 and 1122 are formed, and in another embodiment, may be formed at a different time. The contact openings 1202 and 1302 can be formed before or after the other openings illustrated and described in FIGS. 11 to 13.

The opening 1202 allows for a source/body contact to be made, and the opening 1302 allows for a Schottky contact to be formed. The openings 1202 and 1302 can be formed by patterning the ILD layers 1102 and 702 and the insulating layer 502. In an embodiment, the ILD layer 1102, the insulating layer 502, or both may not be present at all openings. In the embodiments illustrated in FIGS. 11 to 13, the ILD 1102 is not exposed at the openings 1122, 1202, 1302, and 1332, and the insulating layer 502 is not exposed at the opening 1202.

Opening 1202 extends through the source region 644 to the body region 642. In another embodiment, the opening 1202 may extend through the body region 642 to the deep body doped region 542. Opening 1302 extends through the horizontally-oriented doped regions 222 to the resurf region 242. The bottoms of the openings 1202 and 1302 can be doped to form heavily doped regions 1242 and 1342, which allow ohmic contacts to be formed to the body region 642 and the resurf region 242. The heavily doped regions 1242 and 1342 have the same conductivity type as body region 642 and the resurf region 242 and a dopant concentration of at least $1 \times 10^{19}$ atoms/cm$^3$.

In an embodiment, after forming the openings 1202 and 1302, a sacrificial layer (not illustrated) may be formed along exposed portions of source regions 644 and horizontally-oriented doped regions 222 to reduce the likelihood of counterdoping of such regions. If needed or desired, the sacrificial layer may be anisotropically etched along the bottom of the openings 1202 and 1302. The heavily doped regions 1242 and 1342 may be formed by ion implantation or another suitable doping technique. The workpiece may be annealed to activate the dopants introduced into the workpiece during the contact opening process sequence. After doping and anneal, the sacrificial layer is removed to expose portions of the source regions 644 and horizontally-oriented doped regions 222.

Figure 14:
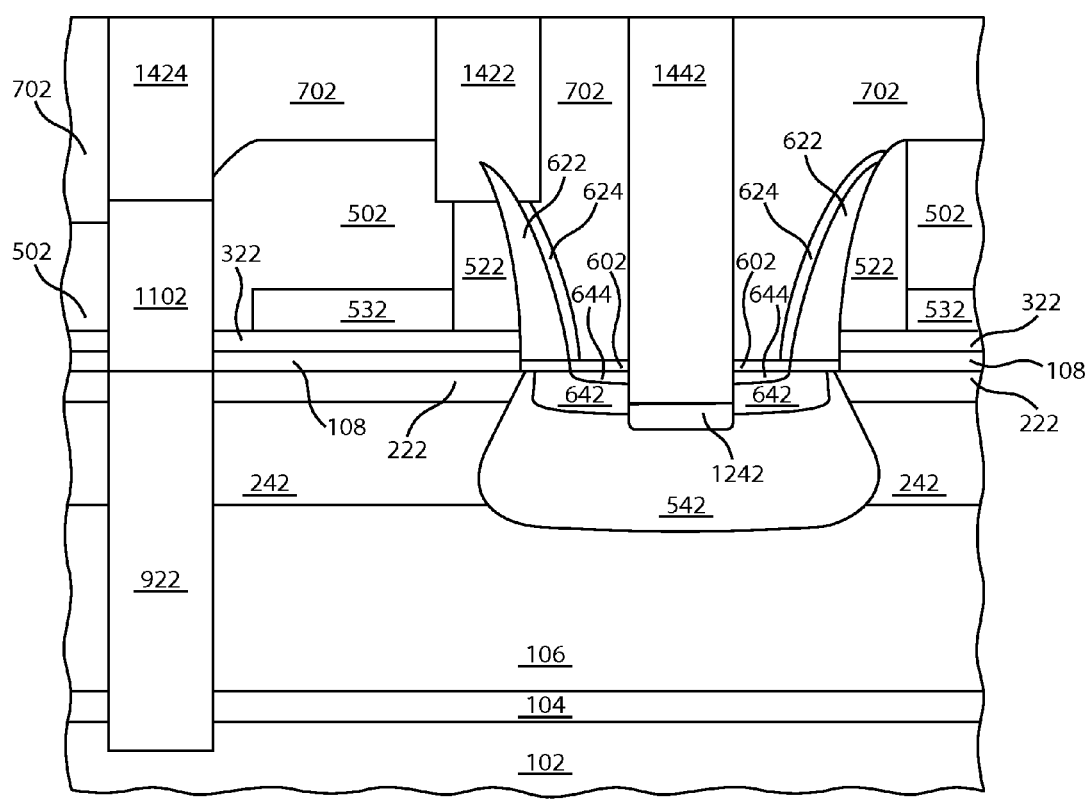
FIGS. 14 and 15 include illustrations of cross-sectional views of the workpiece of FIGS. 12 and 13, respectively, after forming conductive plugs.
Figure 15:
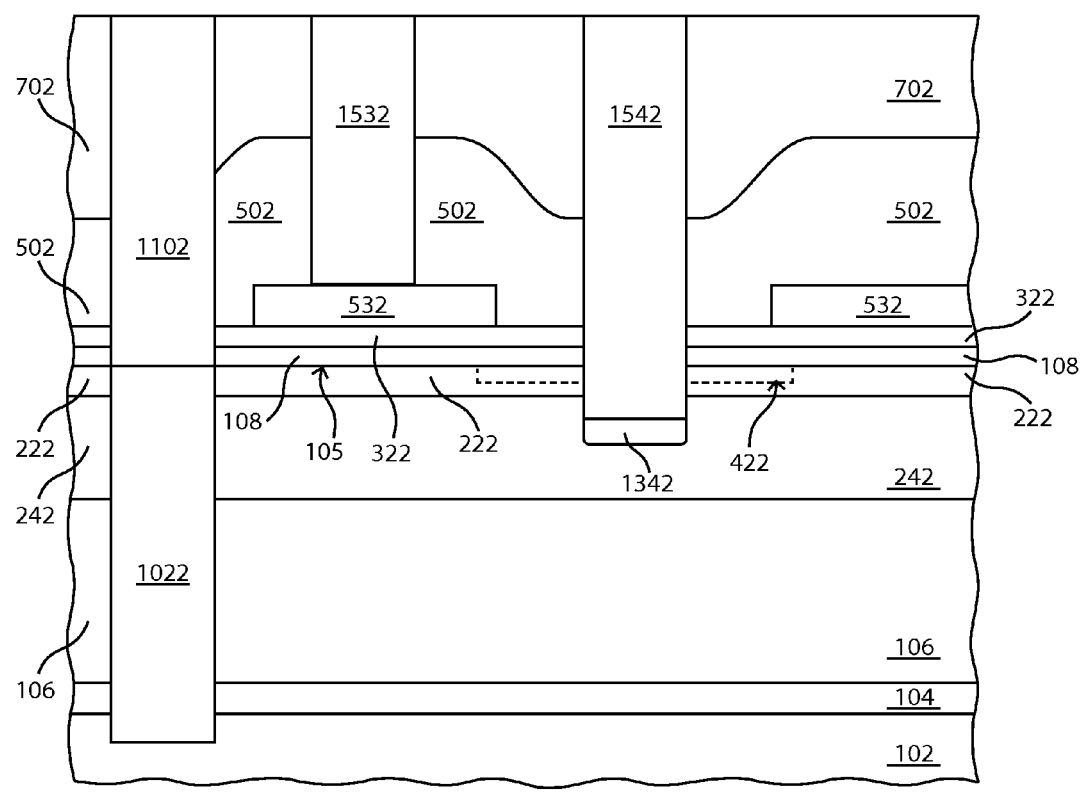

FIGS. 14 and 15 include illustrations after forming conductive plugs 1422, 1424, 1442, 1532, and 1542. FIG. 14 corresponds to the transistor, and FIG. 15 corresponds to region where a Schottky contact is formed. The conductive plug 1422 is electrically connected to the gate electrode 622 of the transistor, the conductive plug 1442 is electrically connected to the source region 644 and the body of the transistor, the conductive plug 1532 is electrically connected to the conductive electrode 532, the conductive plug 1542 is electrically connected to the heavily doped region 1342 and forms a Schottky contact where the conductive plug 1542 contacts the horizontally-oriented doped region 222. The conductive plug 1424 can be electrically connected to the source region 644 of the transistor and is an electrode that can help to provide further shielding to reduce parasitic capacitance to subsequently-formed interconnects that overlie the vertical conductive structure 922. In an embodiment, none of the conductive plugs within the ILD layer 702 is electrically connected to the horizontally-oriented doped regions 222. A drain for the transistor includes a portion of the horizontally-oriented doped regions 222 and is electrically connected to the buried conductive region 102.

In an embodiment, the conductive plugs 1422, 1424, 1442, 1532, and 1542 can be formed using a plurality of films. In an embodiment, a layer including a refractory metal, such as Ti, Ta, W, Co, Pt, or the like, can be deposited over the workpiece and within the openings 1112, 1122, 1202, 1302, and 1322. If needed or desired, a layer including a metal nitride layer can be deposited over the layer including the refractory metal. The workpiece can be annealed so that portions of the layer including the refractory metal are selectively reacted with exposed silicon, such as substantially monocrystalline or polycrystalline silicon, to form a metal silicide. Thus, portions of the gate electrodes 622, conductive electrodes 532, source regions 644, horizontally-oriented doped regions 222, body regions 642, and heavily doped regions 1242 and 1342 can react with the metal within the layer that includes the refractory metal to form a metal silicide. Portions of the layer that include the refractory metal contact insulating layer do not react. A metal nitride layer may be formed to further fill a part, but not the remainder of the openings. The metal nitride layer and can act as a barrier layer. A layer of a conductive material fills the remainder of the contact openings 1112, 1122, 1202, 1302, and 1322. Portions of the layer including the refractory metal, the metal nitride layer and the conductive material that overlies the ILD layer 702 are removed to form the conductive plugs 1422, 1424, 1442, 1532, and 1542.

Referring to FIG. 15, a Schottky contact is formed where the conductive plug 1542 contacts the horizontally-oriented doped region 222. The conductive plug 1542 forms an ohmic contact with the heavily doped region 1342, which is disposed within the resurf region 242, and therefore, the resurf region 242 is electrically connected to the conductive plug 1542. The conductive plug 1542 is spaced apart from the conductive electrode 532. The conductive plug 1542 can be electrically connected to the conductive electrode 532 at a location not illustrated in FIG. 15.

In another embodiment (not illustrated), the conductive electrode may not be patterned over the location where the Schottky contact will be formed. The etch in forming the opening 1302 is performed to pattern the conductive electrode 532, such that the conductive electrode 532 is exposed within the opening 1302. The conductive plug 1542 can contact the conductive electrode 532, such that the conductive electrode 532 is electrically connected to the resurf region 242 via the conductive plug 1542. If the conductive electrode 532 includes amorphous or polycrystalline silicon, a portion of the conductive electrode 532 reacts with the layer of refractory metal within the conductive plug to form a metal silicide. Otherwise, the layer of refractory metal near the conductive electrode 532 remains unreacted.

Figure 16:
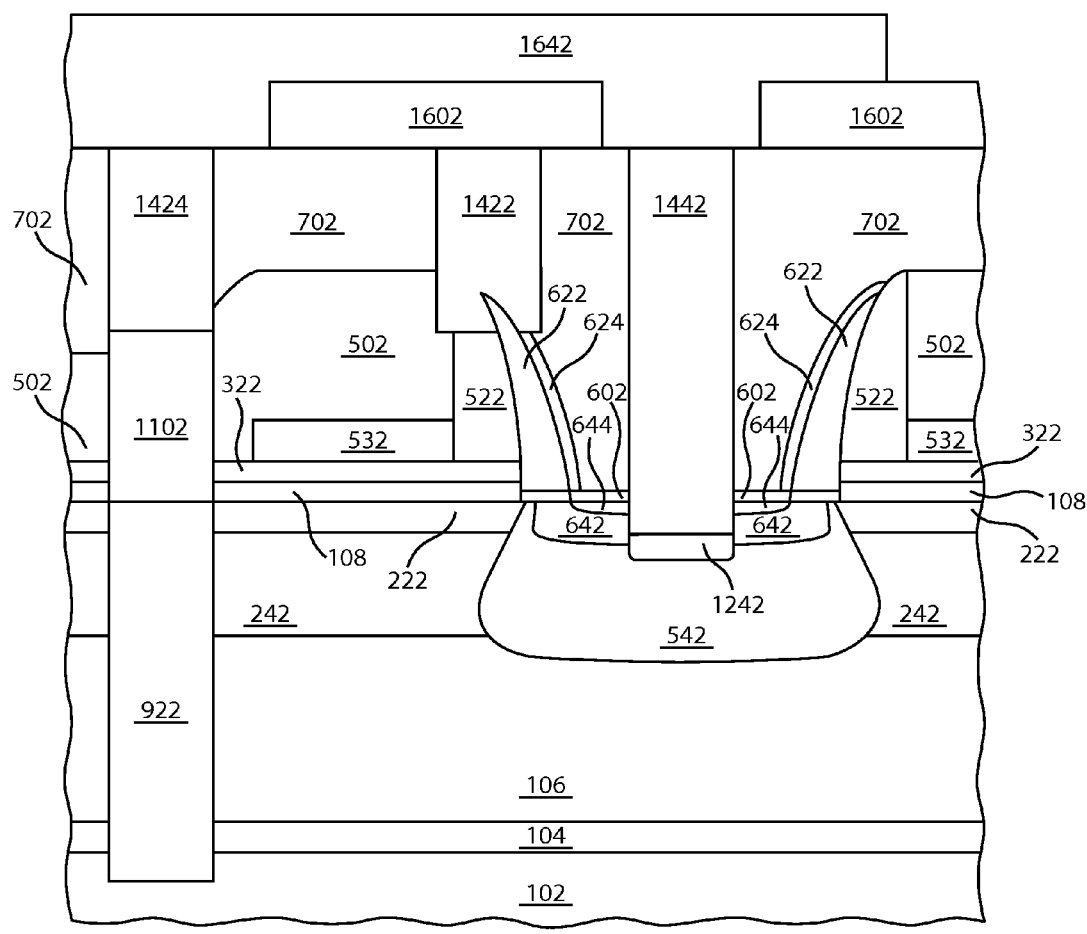
FIGS. 16 and 17 include illustrations of cross-sectional views of the workpiece of FIGS. 14 and 15, respectively, after forming a first level of interconnects for the transistor and Schottky diode.
Figure 17:
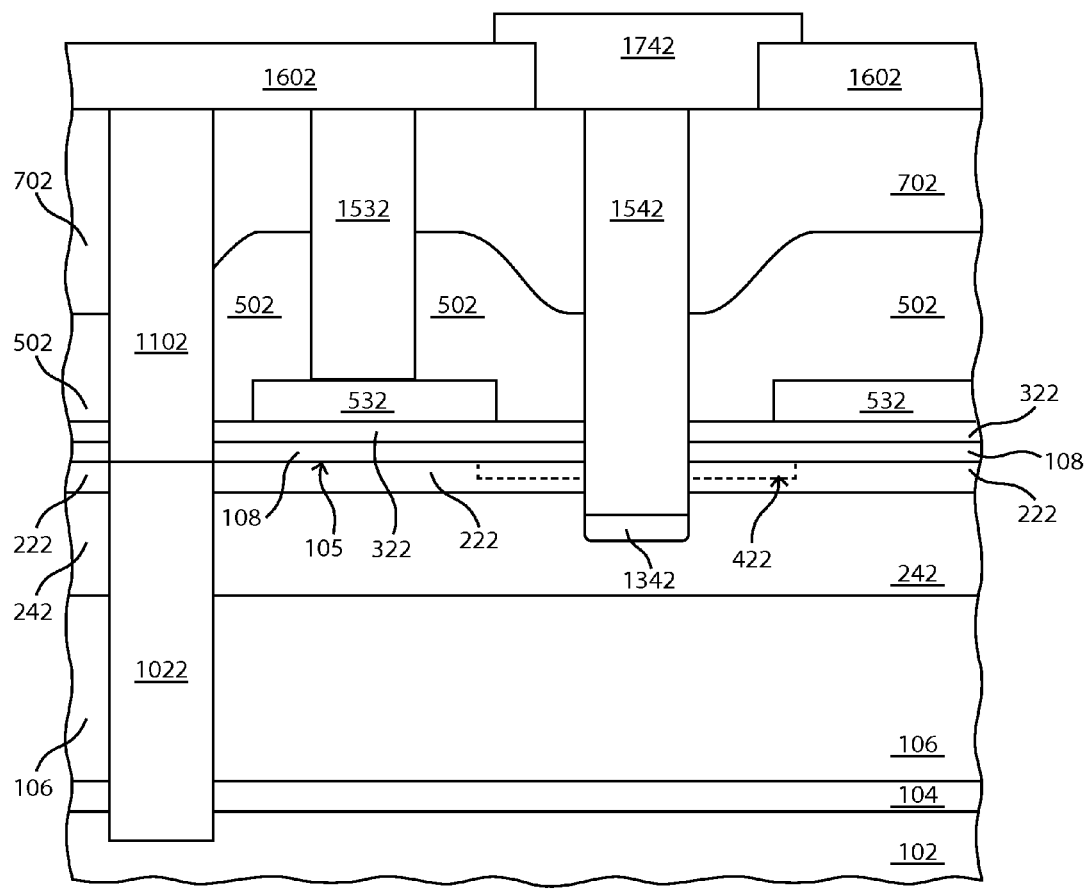

FIGS. 16 and 17 include illustrations of a transistor and a Schottky contact after a first level of interconnects are formed. The ILD layer 1602 can include any of the compositions as previously described with respect to the ILD layer 702. The ILD layer 1602 can have substantially the same composition or a different composition as compared to the ILD layer 702. The ILD layer 1602 is patterned to define contact openings.

Interconnects 1642 and 1742 are formed that extend at least partly within the openings within the ILD layer 1602. The interconnect 1642 electrically connects the source region 644 of transistor 12 and the conductive plug 1424 to each other. The interconnect 1742 is electrically connected to the Schottky contact. In a finished device, the interconnects 1642 and 1742 and the conductive electrode 532 are electrically connected to one another. An interconnect (not illustrated) is electrically connected to the gate electrode 622 via the conductive plug 1422 at a location not illustrated in FIG. 16. For the Schottky contact, the conductive plug 1542 is part of an anode of a Schottky diode, and the horizontally-oriented doped region 222 adjacent to the conductive plug 1542 is part of a cathode of the Schottky diode. From an electrical perspective, interconnects 1742 and 1642 electrically connect the source regions 644 of the transistor and the anode of the Schottky diode to each other, and the buried conductive region 102 electrically connects the drain region of the transistor and the cathode of the Schottky diode to each other. Thus, the transistor and the Schottky diode are connected in parallel. The transistor and Schottky diode may be part of a larger circuit, wherein the Schottky diode may be used to protect the transistor, another component within the circuit, or a load connected to the circuit from large voltage swings, such as during a switching operation when the transistor and Schottky diode are part of a circuit, such as a high-frequency voltage regulator.

Although not illustrated, additional or fewer layers or features may be used as needed or desired to form the electronic device. Field isolation regions are not illustrated but may be used to help electrically isolate portions of the power transistor. In another embodiment, more insulating and interconnect levels may be used. A passivation layer can be formed over the workpiece or within the interconnect levels. After reading this specification, skilled artisans will be able to determine layers and features for their particular application.

The electronic device can include many other transistor structures and Schottky structure that are substantially identical to the transistor structure and Schottky contact as illustrated in FIGS. 16 and 17. The transistor structures can be connected in parallel with each other to form the transistor. Such a configuration can give a sufficient effective channel width of the electronic device that can support the relatively high current flow that is used during normal operation of the electronic device. The Schottky contacts can be integrated into the process flow and occupy a relatively small amount of area.

In still another embodiment, one or more bipolar transistors may be used instead of the field-effect transistors. In this embodiment, current carrying electrodes can include emitter regions and collector regions instead of the source regions and drain regions, and control electrodes can include base regions instead of gate electrodes. If a buried collector is used, the buried collector can be patterned to allow a properly isolated connection to be made to the buried conductive region 102. The Schottky contacts can be integrated into the process flow and occupy a relatively small amount of area.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. An electronic device can include a buried conductive region; a semiconductor layer having a primary surface and an opposing surface, wherein the buried conductive region is disposed closer to the opposing surface than to the primary surface; and a horizontally-oriented doped region adjacent to the primary surface. The electronic device can further include a vertical conductive region adjacent to the primary surface and extending through the semiconductor layer toward the buried conductive region, wherein the vertical conductive region is electrically connected to the horizontally-oriented doped region and the buried conductive region. The electronic device can still further include an insulating layer overlying the horizontally-oriented doped region and the vertical conductive region, and a first conductive electrode overlying the insulating layer and the horizontally-oriented doped region, wherein a portion of the vertical conductive region does not underlie the first conductive electrode.

Item 2. The electronic device of Item 1, further including a second conductive electrode that is disposed over the vertical conductive region, spaced apart from the vertical conductive region at a location over the vertical conductive region, and lies at an elevation higher than the first conductive electrode.

Item 3. The electronic device of Item 1, further including a source region of a power transistor, wherein the source region is electrically connected to the first conductive electrode.

Item 4. The electronic device of Item 1, wherein the horizontally-oriented doped region is part of a drain region of a power transistor.

Item 5. The electronic device of Item 4, further including a gate electrode of the power transistor, wherein the gate electrode is spaced apart from and electrically isolated from the first conductive electrode.

Item 6. The electronic device of Item 1, wherein substantially none of the vertical conductive region is covered by the first conductive electrode.

Item 7. A process of forming an electronic device can include providing a workpiece including a buried conductive region and a semiconductor layer over the buried conductive region, wherein the semiconductor layer has a primary surface and an opposing surface, and wherein the buried conductive region is disposed closer to the opposing surface than to the primary surface. The process can further include forming a conductive electrode, forming a source region of a transistor, and forming a vertical conductive region adjacent to the primary surface and extending through the semiconductor layer toward the buried conductive region, wherein forming the vertical conductive region is performed after forming the conductive electrode. In a finished device, the conductive electrode and the source region can be electrically connected to each other.

Item 8. The process of Item 7, wherein forming the conductive electrode includes forming a conductive layer, and patterning the conductive layer to define an opening above a region of the semiconductor layer in which the vertical conductive region is subsequently formed.

Item 9. The process of Item 8, wherein forming the source region is performed after patterning the conductive layer.

Item 10. The process of Item 7, wherein forming the vertical conductive region includes etching the semiconductor layer to define a trench that extends toward the conductive buried region, and forming a conductive material within the trench to at least partly fill the trench.

Item 11. The process of Item 10, wherein etching the semiconductor layer is performed such that the trench extends to the buried conductive region.

Item 12. The process of Item 10, further including removing a portion of the conductive material lying outside of the trench to form the vertical conductive region.

Item 13. The process of Item 12, wherein the vertical conductive region fills substantially all of the trench.

Item 14. The process of Item 7, further including forming a horizontally-oriented doped region within the semiconductor layer adjacent to the primary surface, wherein a drain region of the transistor includes the horizontally-oriented doped region.

Item 15. The process of Item 7, further including forming an electrical connection between the source region and the conductive electrode, wherein forming the electrical connection is performed after forming the conductive electrode.

Item 16. A process of forming an electronic device can include providing a workpiece including a buried conductive region and a semiconductor layer over the buried conductive region, wherein the semiconductor layer has a primary surface and an opposing surface, and wherein the buried conductive region is disposed closer to the opposing surface than to the primary surface. The process can further include forming a first conductive electrode, forming a gate electrode, and forming a vertical conductive region adjacent to the primary surface and extending through the semiconductor layer toward the buried conductive region, wherein forming the vertical conductive region is performed after forming the gate electrode and forming the first conductive electrode. In a finished device, the first conductive electrode and the gate electrode can be electrically isolated from each other.

Item 17. The process of Item 16, wherein forming the gate electrode is performed after forming the first conductive electrode.

Item 18. The process of Item 16, further including forming a horizontally-oriented doped region within the semiconductor layer adjacent to the primary surface, wherein forming the first conductive electrode is performed after forming the horizontally-oriented doped region.

Item 19. The process of Item 18, further including forming a first insulating layer over the horizontally-oriented doped region and before forming the first conductive electrode, wherein after forming the first conductive electrode, the first conductive electrode is disposed over the insulating layer and the horizontally-oriented doped region.

Item 20. The process of Item 19, further including forming a second insulating layer over the vertical conductive region, wherein the second insulating layer is thicker than the first insulating layer, and forming a second conductive electrode overlying the vertical conductive region.

Item 21. The process of Item 20, further including forming a source region of the transistor, wherein in a finished device, the source region, the first conductive electrode, and the second conductive electrode are electrically connected to one another.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a buried conductive region;
   a semiconductor layer having a primary surface and an opposing surface, wherein the buried conductive region is disposed closer to the opposing surface than to the primary surface;
   a horizontally-oriented doped region adjacent to the primary surface;
   a first vertical conductive region adjacent to the primary surface and extending through the semiconductor layer toward the buried conductive region, wherein the first vertical conductive region is electrically connected to the horizontally-oriented doped region and the buried conductive region;
   a first insulating layer overlying the horizontally oriented doped region;
   a conductive electrode overlying the first insulating layer and the horizontally-oriented doped region; and
   a gate electrode of a power transistor, wherein the gate electrode is spaced apart and electrically isolated from the conductive electrode, wherein the first vertical conductive region does not underlie the conductive electrode.

2. The electronic device of claim 1, further comprising a second conductive electrode that is disposed over the first vertical conductive region, spaced apart from the first vertical conductive region at a location over the first vertical conductive region, and lies at an elevation higher than the conductive electrode.

3. The electronic device of claim 1, further comprising a source region of a power transistor, wherein the source region is electrically connected to the conductive electrode.

4. The electronic device of claim 1, wherein the horizontally-oriented doped region is part of a drain region of the power transistor.

5. The electronic device of claim 1, wherein substantially none of the vertical conductive region is covered by the conductive electrode.

6. The electronic device of claim 1, further comprising a second insulating layer disposed over the first vertical conductive region, wherein the second insulating layer is thicker than the first insulating layer.

7. The electronic device of claim 1, wherein the first vertical conductive region is disposed within a trench extending from the primary surface toward the buried conductive region.

8. The electronic device of claim 1, wherein the buried conductive region comprises a film.

9. An electronic device comprising:
   a buried conductive region;
   a semiconductor layer having a primary surface and an opposing surface, wherein the buried conductive region is disposed closer to the opposing surface than to the primary surface;
   a horizontally-oriented doped region adjacent to the primary surface;
   a vertical conductive region adjacent to the primary surface and extending through the semiconductor layer toward the buried conductive region;
   a first insulating layer overlying the horizontally oriented doped region and the vertical conductive region;
   a conductive electrode overlying the first insulating layer and the horizontally-oriented doped region; and
   a second insulating layer disposed over the vertical conductive region, wherein the second insulating layer does not extend over the conductive electrode.

10. The electronic device of claim 9, wherein the vertical conductive region does not underlie the conductive electrode.

11. The electronic device of claim 9, further comprising a source region of a power transistor, wherein the source region is electrically connected to the conductive electrode.

12. The electronic device of claim 9, wherein substantially none of the vertical conductive region is covered by the conductive electrode.

13. The electronic device of claim 9, further comprising a gate electrode of a power transistor, wherein the gate electrode is spaced apart from and electrically isolated from the conductive electrode.

14. The electronic device of claim 9, wherein the vertical conductive region is disposed within a trench extending from the primary surface toward the buried conductive region.

15. The electronic device of claim 9, wherein the buried conductive region comprises a film.

16. The electronic device of claim 9, wherein the second insulating layer is thicker than the first insulating layer.

17. The electronic device of claim 9, wherein the horizontally-oriented doped region is part of a drain region of a power transistor.

18. An electronic device comprising:
   a buried conductive region disposed entirely below a Schottky diode;
   a semiconductor layer having a primary surface and an opposing surface, wherein the buried conductive region is disposed closer to the opposing surface than to the primary surface;
   a horizontally-oriented doped region adjacent to the primary surface;
   a first vertical conductive region adjacent to the primary surface and extending through the semiconductor layer toward the buried conductive region;
   a first insulating layer overlying the horizontally oriented doped region and the first vertical conductive region;
   a second vertical conductive region adjacent to the primary surface and extending through the semiconductor layer toward the buried conductive region;
   a conductive electrode overlying the first insulating layer and the horizontally-oriented doped region, wherein the first vertical conductive region does not underlie the conductive electrode; and
   a gate electrode of a power transistor, wherein the gate electrode is spaced apart from and electrically isolated from the conductive electrode.

19. The electronic device of claim 18, further comprising a second insulating layer disposed over the first vertical conductive region, wherein the second insulating layer is thicker than the first insulating layer.

20. The electronic device of claim 18, further comprising a source region of a power transistor, wherein the source region is electrically connected to the conductive electrode.

* * * * *